(12) United States Patent
Kim et al.

(10) Patent No.: US 12,089,384 B2
(45) Date of Patent: Sep. 10, 2024

(54) ELECTRONIC DEVICE

(71) Applicant: SAMSUNG ELECTRONICS CO., LTD., Suwon-si (KR)

(72) Inventors: Hojong Kim, Suwon-si (KR); Changhwan Jin, Suwon-si (KR); Jonghun Choi, Suwon-si (KR); Byungchul Lee, Suwon-si (KR); Jaeyoung Huh, Suwon-si (KR); Hyunchul Hong, Suwon-si (KR); Jaeuk Ryu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 17/436,357

(22) PCT Filed: Aug. 10, 2021

(86) PCT No.: PCT/KR2021/010539
§ 371 (c)(1),
(2) Date: Sep. 3, 2021

(87) PCT Pub. No.: WO2022/035171
PCT Pub. Date: Feb. 17, 2022

(65) Prior Publication Data
US 2022/0330463 A1 Oct. 13, 2022

(30) Foreign Application Priority Data
Aug. 11, 2020 (KR) .......... 10-2020-0100600

(51) Int. Cl.
*G01R 15/04* (2006.01)
*G01R 19/10* (2006.01)
(Continued)

(52) U.S. Cl.
CPC .......... *H05K 9/0028* (2013.01); *G01R 15/04* (2013.01); *G01R 19/10* (2013.01); *H05K 1/0216* (2013.01)

(58) Field of Classification Search
CPC .. H05K 9/0028; H05K 1/0216; H05K 3/3452; H05K 2201/10371; H05K 9/0032; G01R 15/04; G01R 19/10
(Continued)

(56) References Cited

U.S. PATENT DOCUMENTS 9,538,693 B2 * 1/2017 Kurz .................... H05K 9/0032
2005/0231932 A1 * 10/2005 Nestor ................. H05K 7/1461
361/818
(Continued)

FOREIGN PATENT DOCUMENTS

JP 2001-111282 4/2001
JP 2004-303926 10/2004
(Continued)

OTHER PUBLICATIONS

Search Report dated Nov. 18, 2021 in counterpart International Application No. PCT/KR2021/010539 and English-language translation.
(Continued)

*Primary Examiner* — Christopher P McAndrew
(74) *Attorney, Agent, or Firm* — Nixon & Vanderhye, P.C.

(57) ABSTRACT

An electronic device including a substrate on which an electronic component is mounted according to various embodiments may include: a first electromagnetic interference (EMI) shield configured to shield the electronic component included in a first region of the substrate; and a second EMI shield supported by at least a part of the first
(Continued)

EMI shield and configured to shield the electronic component included in a second region of the substrate.

14 Claims, 14 Drawing Sheets

(51) Int. Cl.
*H05K 1/02* (2006.01)
*H05K 9/00* (2006.01)

(58) Field of Classification Search
USPC .................................................. 324/750.26
See application file for complete search history.

(56) References Cited

U.S. PATENT DOCUMENTS

| | | | |
|---|---|---|---|
| 2010/0149780 A1 | 6/2010 | Ren et al. | |
| 2014/0307392 A1* | 10/2014 | Kurz | H05K 9/0081 |
| | | | 361/720 |
| 2015/0181772 A1* | 6/2015 | Ady | H05K 9/0022 |
| | | | 361/752 |
| 2015/0242025 A1* | 8/2015 | Cok | H05K 1/0296 |
| | | | 29/622 |
| 2016/0242331 A1* | 8/2016 | Park | H05K 9/0032 |
| 2017/0202495 A1* | 7/2017 | Dalene | A61B 5/14552 |
| 2018/0084680 A1* | 3/2018 | Jarvis | H05K 1/148 |
| 2020/0178415 A1 | 6/2020 | Kim et al. | |

FOREIGN PATENT DOCUMENTS

| | | |
|---|---|---|
| JP | 2009-295721 | 12/2009 |
| KR | 10-2010-0126879 | 12/2010 |
| KR | 10-2018-0126849 | 11/2018 |

OTHER PUBLICATIONS

Written Opinion dated Nov. 18, 2021 in counterpart International Application No. PCT/KR2021/010539 and English-language translation.

* cited by examiner

ELECTRONIC DEVICE

This application is the U.S. national phase of International Application No. PCT/KR2021/010539 filed Aug. 10, 2021, which designated the U.S. and claims priority to Korean Patent Application No. 10-2020-0100600 filed Aug. 11, 2020, the entire contents of each of which are hereby incorporated by reference.

BACKGROUND

Field

The disclosure relates to an electronic device including a shield case.

Description of Related Art

Electronic devices such as smartphones, wearable devices, and Internet-of-Things (IoT) devices have recently become compact while incorporating various functions. Such trends towards multifunctionality and compactness may cause high-density mounting inside electronic devices and increase operating frequency bands thereof, thereby emitting electromagnetic waves that may result in electromagnetic interference or noise.

There is a need for a technology capable of blocking unintended unnecessary electromagnetic interference (EMI) of electronic devices.

SUMMARY

An electronic device may include a shield case (or shield can) in order to block electromagnetic interference. The shield case may include an inner well in order to block electromagnetic interference between electronic components. A shield case having an inner well structure may be detached, when seated on a circuit board (for example, PCB), and may have difficulty in blocking electromagnetic waves. In addition, it may be difficult to inspect whether a shield case having an inner well structure has undergone detachment during manufacturing.

Embodiments of the disclosure provide a shield case and an electronic device including a shield case, and provide a shield case having a lamination structure capable of blocking electromagnetic waves between components.

An electronic device including a substrate on which an electronic component is mounted according to various example embodiments of the disclosure may include: a first electromagnetic interference shield configured to shield the electronic component included in a first region of the substrate; and a second electromagnetic interference shield supported by at least a part of the first shield and configured to shield the electronic component included in a second region of the substrate.

A method for mounting a shield case of an electronic device according to various example embodiments of the disclosure may include: coupling, to a substrate, a first electromagnetic interference shield including a first shield frame configured to surround a first region of the substrate and a first shield cover configured to cover the first region; and coupling a second electromagnetic interference shield including a second shield frame configured to surround at least a part of a second region of the substrate and a second shield cover configured to cover the second region to the substrate and at least a part of the first shield cover.

A method for forming a pad of an electromagnetic interference shield according to various example embodiments of the disclosure may include: stably placing an electromagnetic interference shield on a jig; applying a solder resist after stably placing a mask on an upper end of the electromagnetic interference shield stably seated on the jig; applying a flux after removing the mask; and applying a solder paste after stably placing a metal mask having an opening corresponding to the applied flux.

A shield case test method according to various example embodiments of the disclosure may include: stably placing a shield case on a substrate; connecting a test apparatus to a conductive material corresponding to the shield case at a bottom of the substrate; and transferring a voltage to the conductive material through a voltage divider of the test apparatus, and identifying a voltage difference using the test apparatus to determine whether the shield case is stably placed.

A shield case and an electronic device according to various example embodiments of the disclosure use a shield case having a lamination structure such that electromagnetic interference between components of a substrate (for example, PCB) of the electronic device can be blocked and/or reduced without detachment thereof.

A shield case and an electronic device according to various example embodiments of the disclosure are advantageous in that the same include a shield case having a lamination structure, thereby making fabrication thereof easier than an inner-well-type shield case and repair thereof simpler.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In the drawings, same or similar reference numbers may be used to denote the same or similar components.

DETAILED DESCRIPTION

Figure 1:
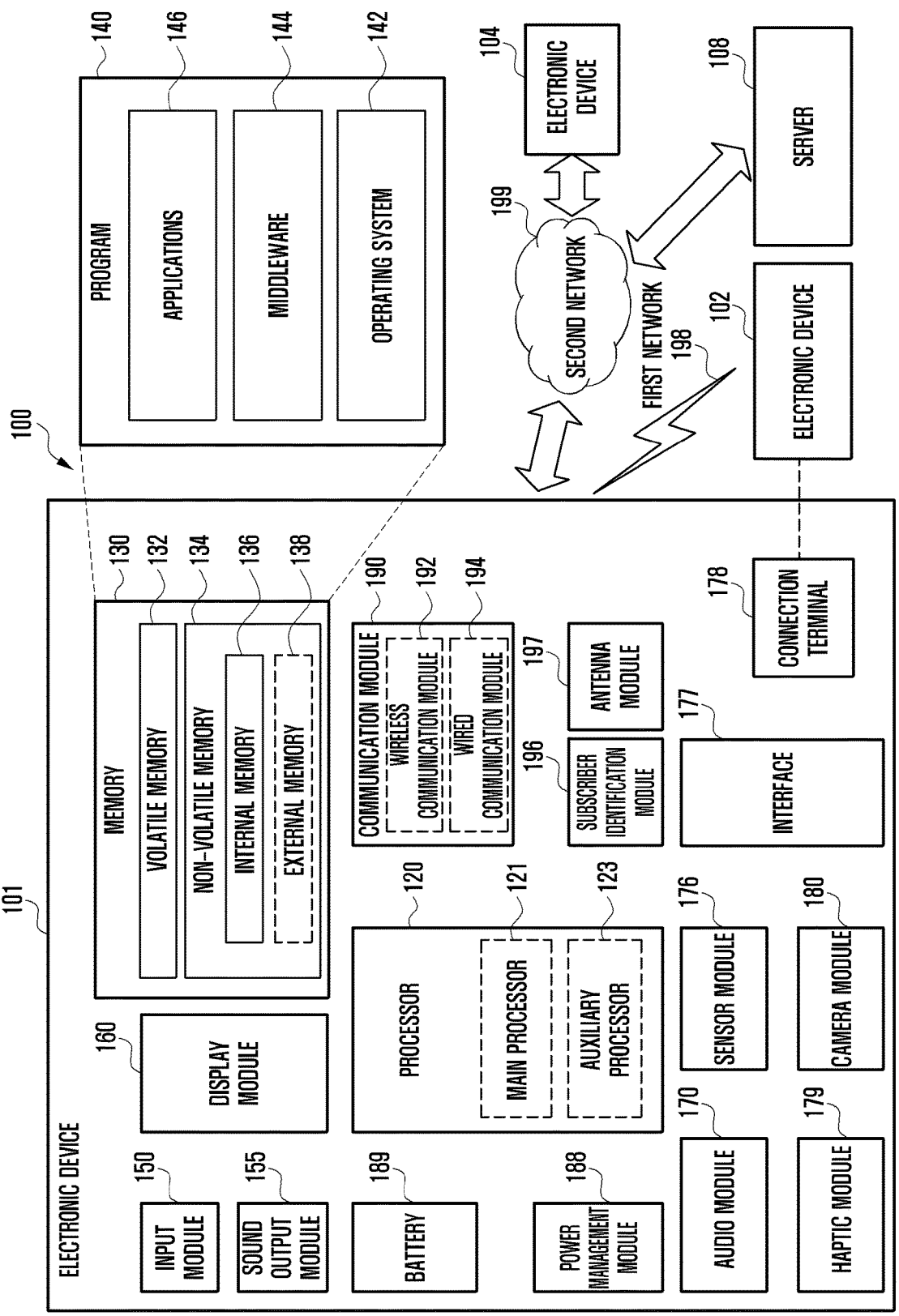
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added.

Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
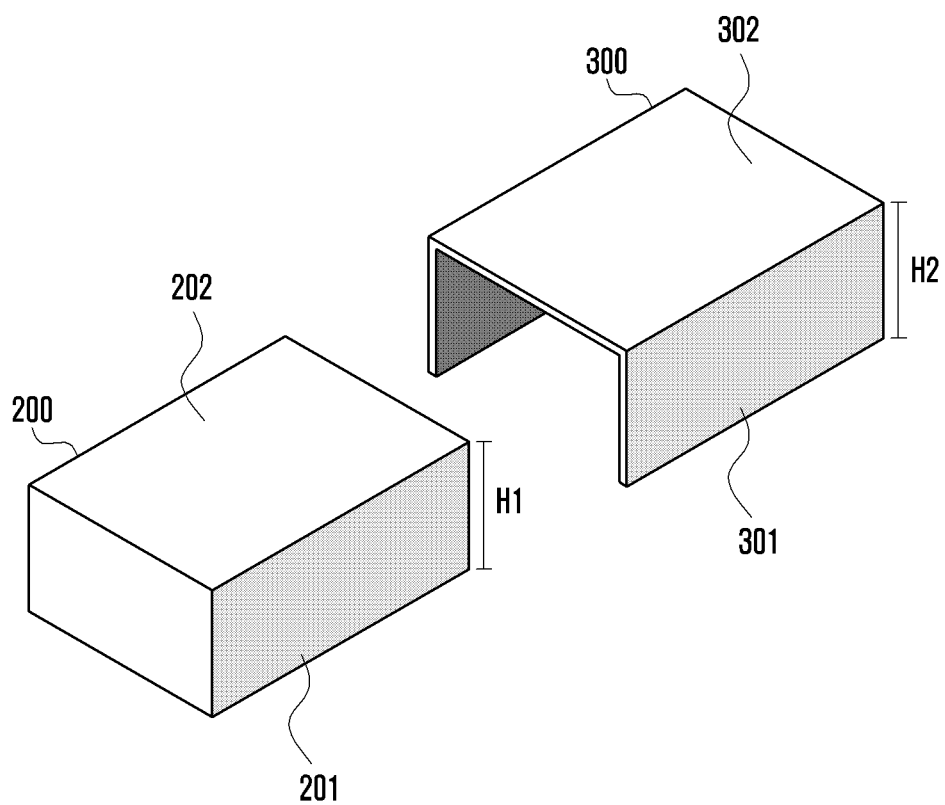
FIG. 2 is an exploded perspective view illustrating an example shield case according to various embodiments.

FIG. 2 is an exploded perspective view illustrating an example shield case viewed in a planar direction according to various embodiments.

Figure 3:
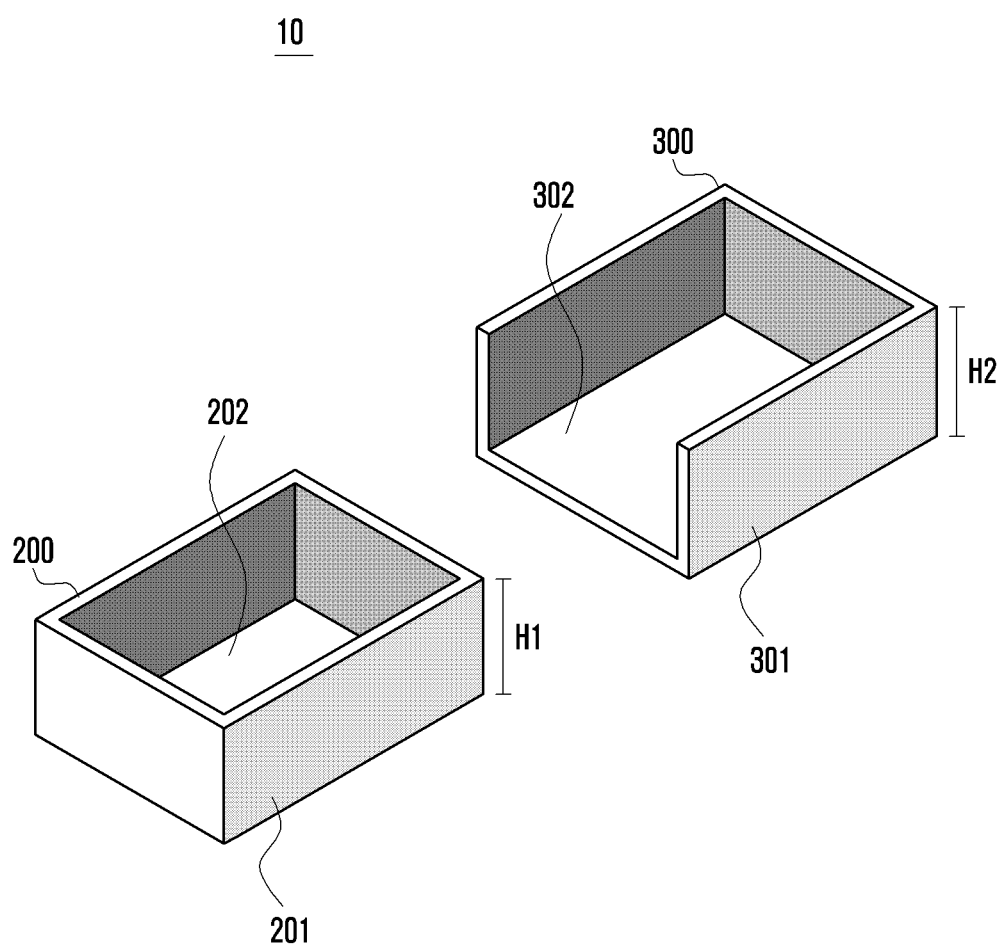
FIG. 3 is an exploded perspective view of a shield case according to various embodiments.

FIG. 3 is an exploded perspective view illustrating an example shield case viewed in a bottom direction according to various embodiments.

Referring to FIGS. 2 and 3, a shield case 10 may include a first shield member (e.g., a shield) 200 and a second shield member (e.g., a shield) 300.

The first shield member 200 may include a first shield frame 201 and a first shield cover 202.

The first shield frame 201 may surround an electronic component and may be mounted on a substrate to support the first shield cover 202. The first shield frame 201 may have a closed curve shape in which a start point and an end point are the same, so as to surround the electronic component. The first shield frame 201 may have a first height H1. The first shield frame 201 may surround a lateral surface of the first shield cover 202.

The first shield cover 202 may, for example, be a plate-shaped member and be supported by the first shield frame 201. The first shield cover 202 may cover the electronic component and the first shield frame 201.

The first shield cover 202 may be spaced apart from the substrate by the distance H1 of the first shield frame 201 so as to form a space. The first shield frame 201 may surround a space between the first shield cover 202 and the substrate. The first shield frame 201 and the first shield cover 202 may be an integral member, or each of the first shield frame 201 and the first shield cover 202 may be configured as separate members.

The second shield member 300 may include a second shield frame 301 and a second shield cover 302.

At least a part of the second shield frame 301 may at least partially surround an electronic component and may be mounted on the substrate to support the second shield cover 302. At least a part of the second shield frame 301 may have an open (opening) shape. The second shield frame 301 may have an open curve shape in which a start point and an end point do not meet. The second shield frame 301 may have a second height H2. When the second shield frame 301 is coupled to the substrate, at least a part of the first shield frame 201 may be coupled to an opening of the second shield frame.

The second shield cover 302 may be spaced apart from the substrate by the second distance H2 of the second shield frame 301 to form a space. The second shield frame 301 and at least a part of the first shield frame 201 may surround a space between the second shield cover 302 and the substrate. The second shield frame 301 may surround at least a part of a lateral surface of the second shield cover 302. The first height H1 of the first shield frame 201 and the second height H2 of the second shield frame 301 may be the same. The second height H2 of the second shield frame 301 may be greater than the first height H1 of the first shield frame 201.

The second shield cover 302 may be a plate-shaped member and be supported by the second shield frame 301. The second shield cover 302 may cover the electronic component and the second shield frame 301.

In various embodiments, the second shield cover 302 may be supported by the second shield frame 301, at least a part of the first shield frame 201, and at least a part of the first shield cover 202.

Figure 4:
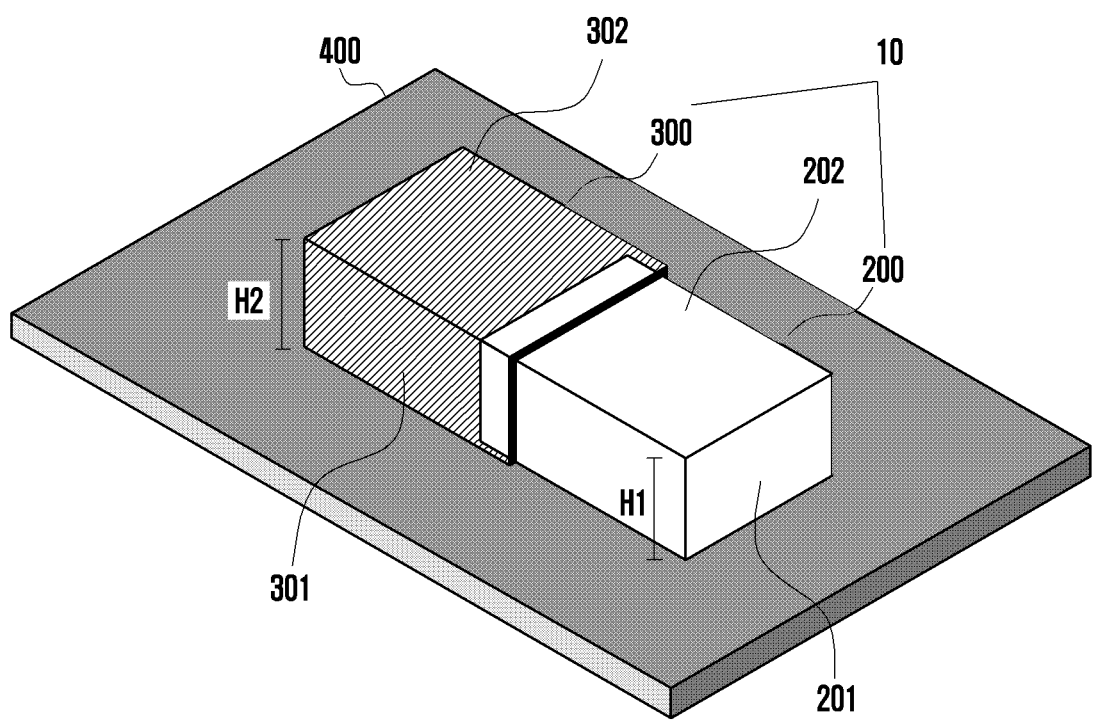
FIG. 4 is a perspective view illustrating a coupling of a shield case and a substrate according to various embodiments.

FIG. 4 is a perspective view illustrating an example coupling of a shield case 10 and a substrate 400 according to various embodiments.

The first shield member 200 may be coupled to a first region of the substrate 400. The first shield cover 202 of the first shield member 200 may be spaced apart from the substrate 400 by the height H1 of the first shield frame 201 to form a space. The first shield frame 201 may surround a space between the first shield cover 202 and the substrate 400.

The second shield member 300 may be coupled to a second region of the substrate 400. The second shield cover 302 may be spaced apart from the substrate by the second height H2 of the second shield frame 301 to form a space. The second shield frame 301 and at least a part of the first shield frame 201 may surround a space between the second shield cover 302 and the substrate.

Figure 5:
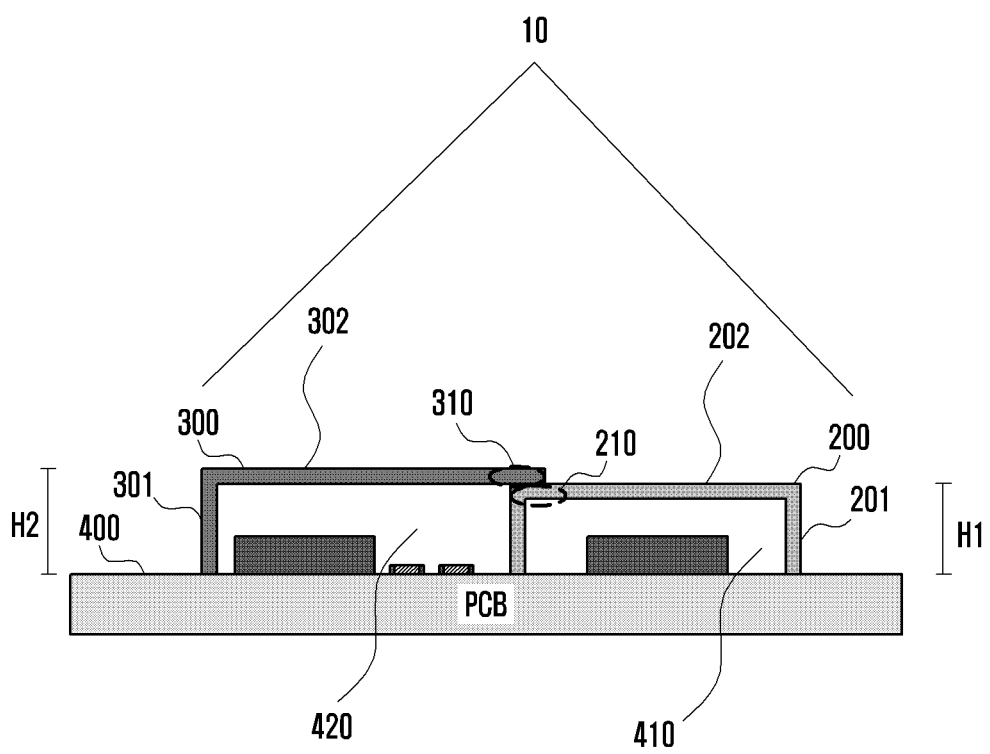
FIG. 5 is a cross-sectional view illustrating the coupling of the shield case and the substrate 400 of FIG. 4 according to various embodiments.

FIG. 5 is a cross-sectional view illustrating the coupling of the shield case 10 and the substrate 400 of FIG. 4 according to various embodiments.

The first shield member 200 may be coupled to a first region 410 of the substrate 400. The first shield cover 202 of the first shield member 200 may be spaced apart from the substrate 400 by the height H1 of the first shield frame 201 to form a space. The first shield frame 201 may surround a space between the first shield cover 202 and the substrate 400. The first shield member 200 may shield electromagnetic waves emitted by an electronic component included in the first region 410 of the substrate 400 and include a material capable of shielding electromagnetic waves.

The second shield member 300 may be coupled to a second region 420 of the substrate 400. The second shield cover 302 may be spaced apart from the substrate by the second height H2 of the second shield frame 301 to form a space. The second shield frame 301 and at least a part of the first shield frame 201 may at least partially surround a space between the second shield cover 302 and the substrate. The second shield member 300 may shield electromagnetic waves emitted by an electronic component included in the second region 420 of the substrate 400 and include a material capable of shielding electromagnetic waves.

A first coupling region 210 of the first shield member 200 and a second coupling region 310 of the second shield member 300 may be coupled to each other to form the shield case 10.

The first coupling region 210 of the first shield member 200 may be an outer region of the first shield member 200, and the second coupling region 310 of the second shield member 300 may be an inner region of the second shield member 300.

The second shield member 300 may be stacked on and coupled to the first shield member 200.

The first coupling region 210 of the first shield member 200 and the second coupling region 310 of the second shield member 300 may be coupled to each other using, for example, and without limitation, a surface mount technology (SMT) or may be coupled using an adhesive member.

The first coupling region 210 of the first shield member 200 and the second coupling region 310 of the second shield member 300 may be coupled in a step form due to the height difference between the first shield frame 201 and the second shield frame 301.

Figure 6A:
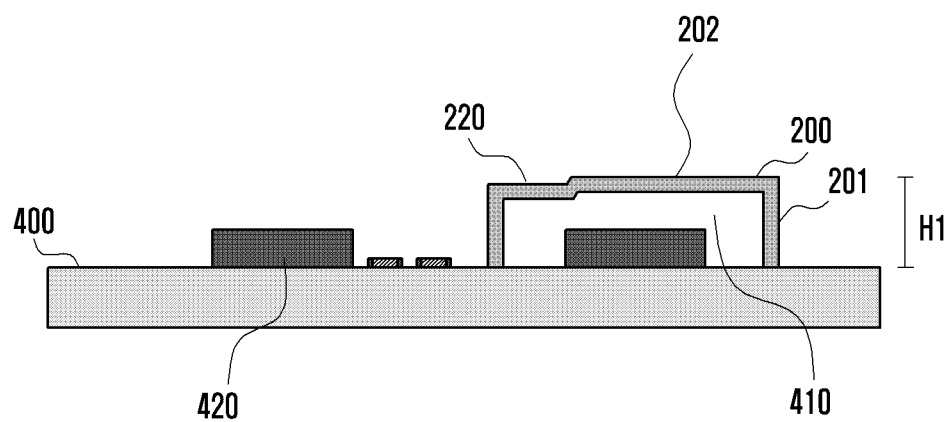
FIGS. 6A and 6B are cross-sectional views illustrating the coupling of the shield case and the substrate of FIG. 4 according to various embodiments.
Figure 6B:
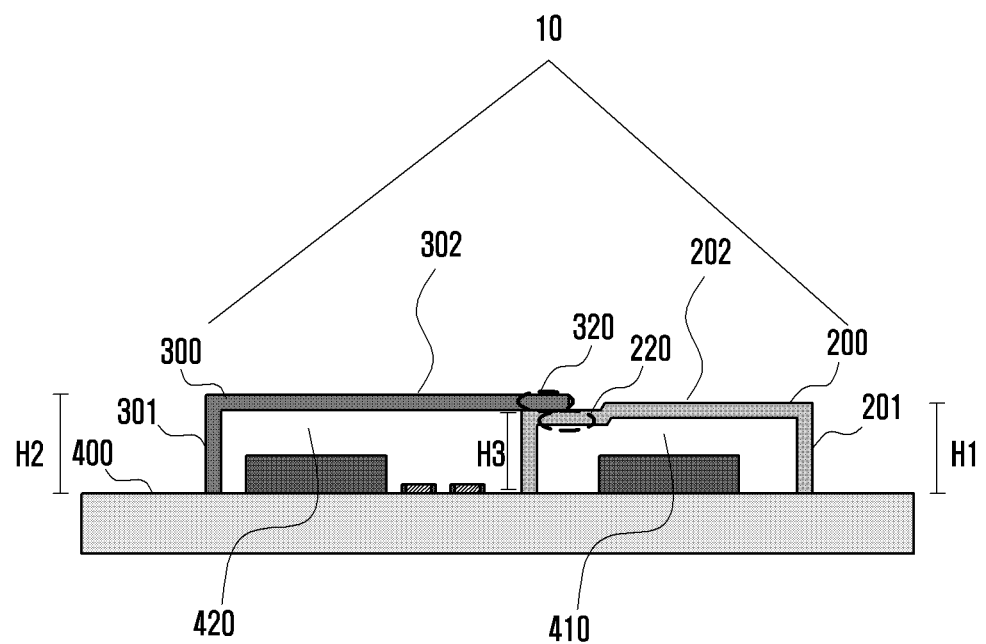

FIGS. 6A and 6B are cross-sectional views illustrating the coupling of the shield case 10 and the substrate 400 of FIG. 4 according to various embodiments.

In FIG. 6A, the first shield member 200 may be coupled to the first region 410 of the substrate 400. The first shield cover 202 of the first shield member 200 may be spaced apart from the substrate 400 by the height H1 of the first shield frame 201 to form a space. The first shield frame 201 may surround a space between the first shield cover 202 and the substrate 400. The first shield member 200 may shield electromagnetic waves emitted by an electronic component included in the first region 410 of the substrate 400.

In FIG. 6B, the second shield member 300 may be coupled to the second region 420 of the substrate 400. The second shield cover 302 may be spaced apart from the substrate by the second height H2 of the second shield frame 301 to form a space. The second shield frame 301 and at least a part of the first shield frame 201 may surround a space between the second shield cover 302 and the substrate. The second shield member 300 may shield electromagnetic waves emitted by an electronic component included in the second region 420 of the substrate 400.

Referring to FIGS. 6A and 6B, a third coupling region 220 of the first shield member 200 and a fourth coupling region 320 of the second shield member 300 may be coupled to each other to form the shield case 10.

The third coupling region 220 of the first shield member 200 may be an outer region of the first shield member 200, and the fourth coupling region 320 of the second shield member 300 may be an inner region of the second shield member 300.

The second shield member 300 may be stacked on and coupled to the first shield member 200.

The third coupling region 220 of the first shield member 200 and the fourth coupling region 320 of the second shield member 300 may be coupled to each other by, for example, and without limitation, a surface mount technology (SMT) or may be coupled using an adhesive member.

The third coupling region 220 of the first shield member 200 may include a partial region of the first shield frame 201 and a partial region of the first shield cover 202.

In various embodiments, the first height H1 of the first shield frame 201 may be different from the second height H2 of the second shield frame 301. A third height H3 of a partial region of the first shield frame 201 may be the same as the second height H2. The first shield cover 202 may have a height difference corresponding to the thickness length of the second shield cover 302 in a region other than the region in which the same is coupled to the second shield cover 302.

In various embodiments, the first height H1 of the first shield frame 201 may be the same as the second height H2 of the second shield frame 301. The first height H1 of the first shield frame 201 may be the same as the second height H2 of the second shield frame 301, and a partial region of the first shield frame 201 may have the third height H3 obtained by subtracting the thickness length of the second shield cover 301 from the first height H1 of the first shield frame 201. When the third coupling region 220 of the first shield member 200 and the fourth coupling region 320 of the second shield member 300 are coupled to each other, the third coupling region and the fourth coupling region may, for example, be coupled seamlessly without a height difference.

Figure 7A:
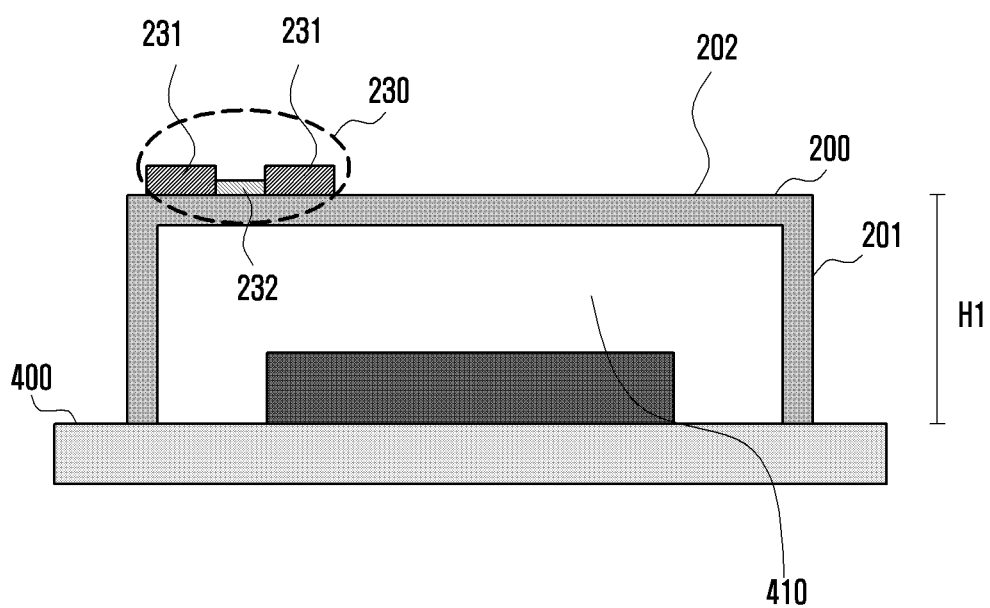
FIGS. 7A and 7B are cross-sectional views illustrating the coupling of the shield case and the substrate of FIG. 4 according to various embodiments.
Figure 7B:
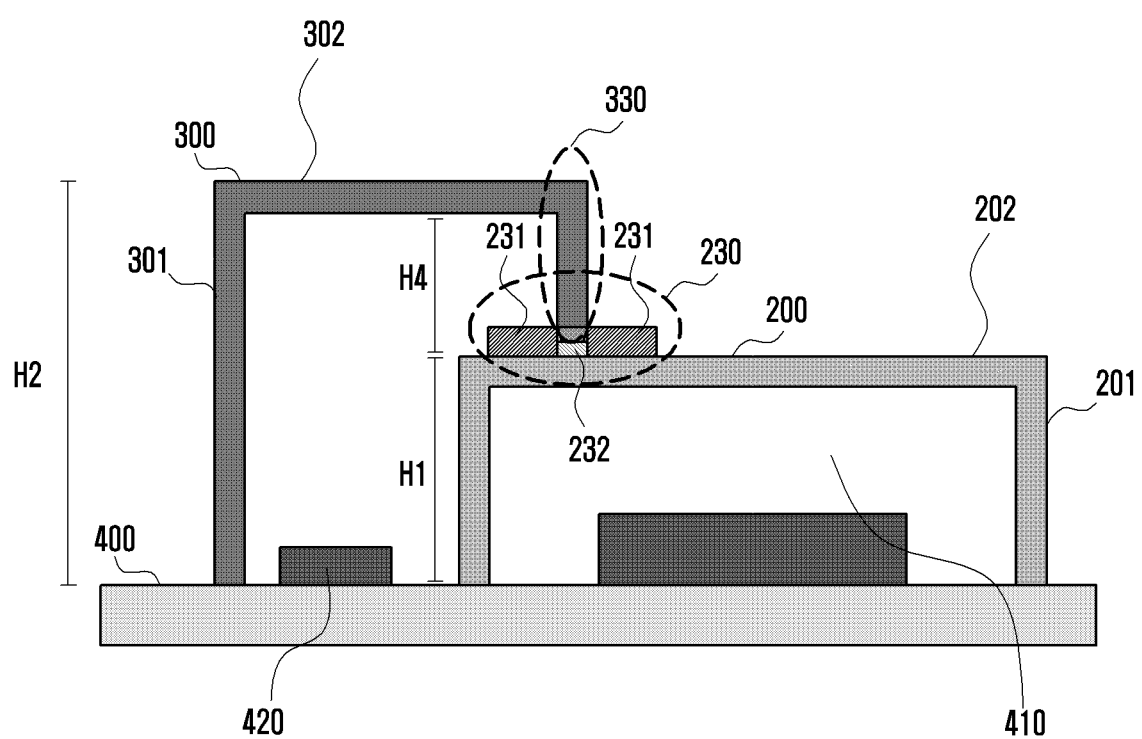

FIGS. 7A and 7B are cross-sectional views illustrating example coupling of the shield case 10 and the substrate 400 of FIG. 4 according to various embodiments.

In FIG. 7A, the first shield member 200 may be coupled to the first region 410 of the substrate 400. The first shield cover 202 of the first shield member 200 may be spaced apart from the substrate 400 by the height H1 of the first shield frame 201 to form a space. The first shield frame 201 may surround a space between the first shield cover 202 and the substrate 400. The first shield member 200 may shield electromagnetic waves emitted by an electronic component included in the first region 410 of the substrate 400.

In FIG. 7B, the second shield member 300 may be coupled to the second region 420 of the substrate 400. The second shield cover 302 may be spaced apart from the substrate by the second height H2 of the second shield frame 301 to form a space. The second shield frame 301 and at least a part of the first shield frame 201 may surround a space between the second shield cover 302 and the substrate. The second shield member 300 may shield electromagnetic waves emitted by an electronic component included in the second region 420 of the substrate 400.

Referring to FIGS. 7A and 7B, a fifth coupling region 230 of the first shield member 200 and a sixth coupling region 330 of the second shield member 300 may be coupled to each other to form the shield case 10.

The second shield member 300 may be stacked on and coupled to the first shield member 200.

The fifth coupling region 230 of the first shield member 200 may, for example, include a pad. The fifth coupling region 230 of the first shield member 200 may include, for example, a pad including solder resist layers 231 on opposite side surfaces with reference to a conductive layer 232. The fifth coupling region 230 may be disposed along one side surface of the outside (outer) of the first shield cover 202.

The sixth coupling region 330 of the second shield member 300 may be a part of the second shield frame 301 having a fourth height H4. A part of the second shield frame 301 having the fourth length H4, if coupled to the fifth coupling region 230, may have the same height as the second height H2 of the second shield frame 301.

Figure 8A:
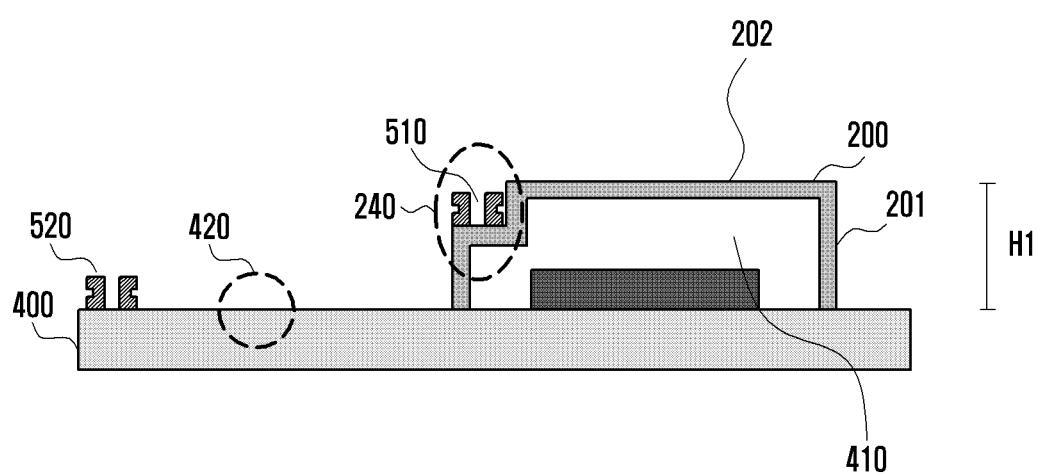
FIGS. 8A and 8B are cross-sectional views illustrating the coupling of the shield case and the substrate of FIG. 4 according to various embodiments.
Figure 8B:
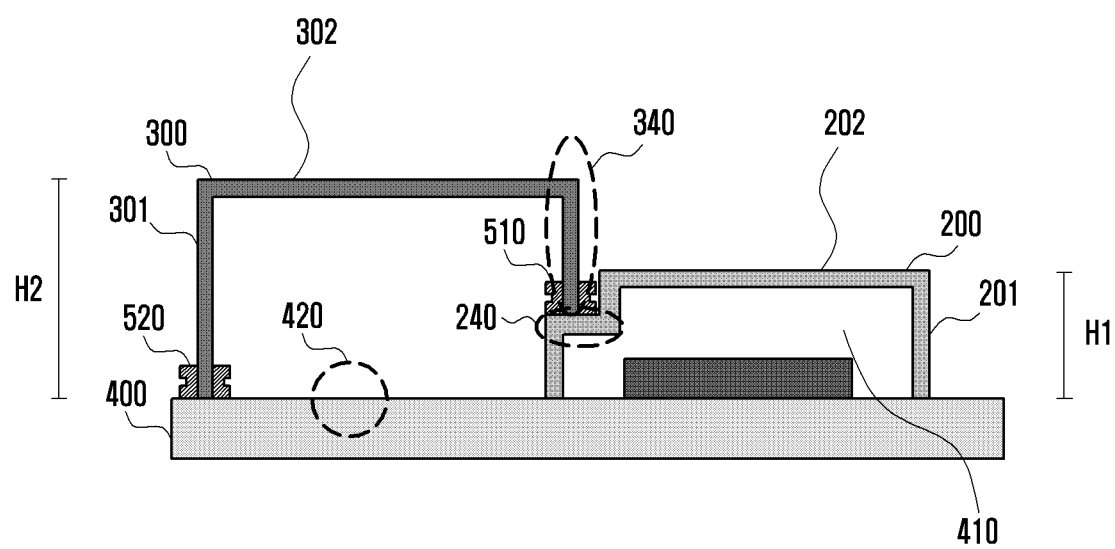

FIGS. 8A and 8B are cross-sectional views illustrating example coupling of the shield case 10 and the substrate 400 of FIG. 4 according to various embodiments.

In FIG. 8A, the first shield member 200 may be coupled to the first region 410 of the substrate 400. The first shield cover 202 of the first shield member 200 may be spaced apart from the substrate 400 by the height H1 of the first shield frame 201 to form a space. The first shield frame 201 may surround a space between the first shield cover 202 and the substrate 400. The first shield member 200 may shield electromagnetic waves emitted by an electronic component included in the first region 410 of the substrate 400.

In FIG. 8B, the second shield member 300 may be coupled to the second region 420 of the substrate 400. The second shield cover 302 may be spaced apart from the substrate by the second height H2 of the second shield frame 301 to form a space. The second shield frame 301 and at least a part of the first shield frame 201 may surround a space between the second shield cover 302 and the substrate. The second shield member 300 may shield electromagnetic waves emitted by an electronic component included in the second region 420 of the substrate 400.

Referring to FIGS. 8A and 8B, a seventh coupling region 240 of the first shield member 200 and an eighth coupling region 340 of the second shield member 300 may be coupled to each other to form the shield case 10.

The second shield member 300 may be stacked on and coupled to the first shield member 200. The seventh coupling region 240 of the first shield member 200 may include a first fixing member 510, and the seventh coupling region 240 may have a height difference from a height of one side of the first shield cover 202. The first shield cover 202 may include the seventh coupling region 240.

The first fixing member 510 may be coupled to the seventh coupling region 240 by, for example, and without limitation, a surface mount technology (SMT) or may be coupled using an adhesive member. The first fixing member 510 may be disposed along one side surface of the outside (outer) of the first shield cover 202.

A second fixing member 520 may be coupled to the substrate 400 by, for example, and without limitation, a surface mount technology (SMT) or may be coupled using an adhesive member. In various embodiments, the second fixing member 520 may be omitted.

The eighth coupling region 340 of the second shield member 300 may be a part of the second shield frame 301 having a predetermined length. A part of the second shield frame 301 having the predetermined length, if coupled to the seventh coupling region 240, may have the same length as the second height H2 of the second shield frame 301.

The second shield frame 301 may be coupled to the substrate 400 and/or the first shield member 200 using the first fixing member 510 and/or the second fixing member 520.

The first fixing member 510 and/or the second fixing member 520 may include, for example, and without limitation, a clip and/or a socket.

Figure 9:
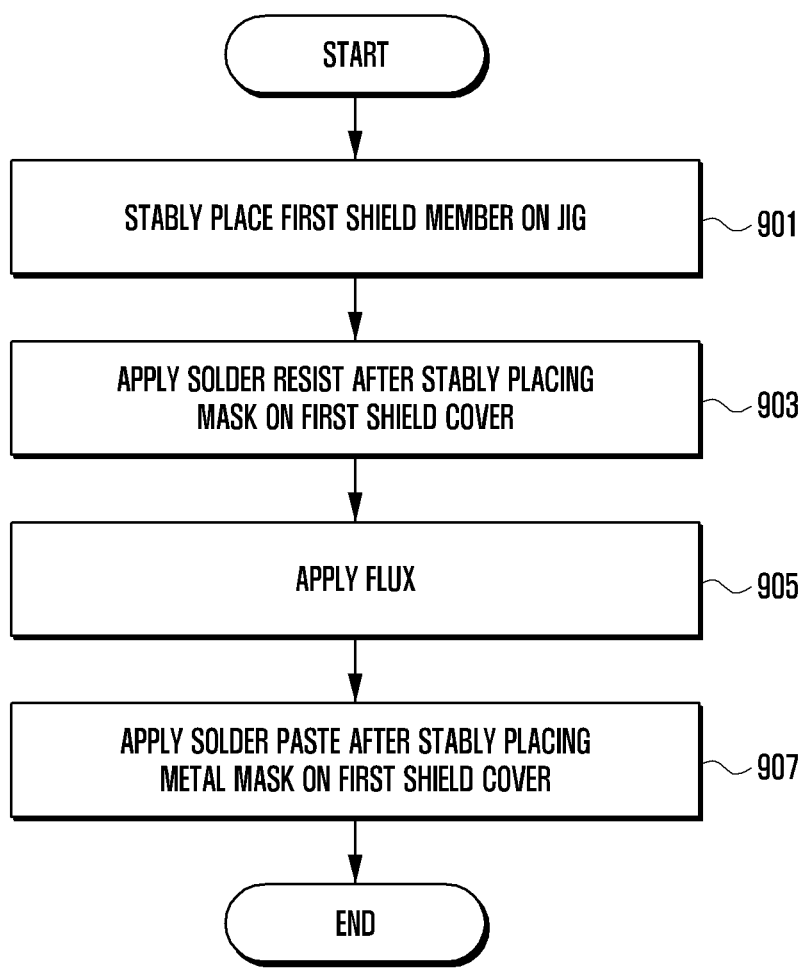
FIG. 9 is a flowchart illustrating an example method for forming a pad on a first shield member according to various embodiments.

FIG. 9 is a flowchart illustrating an example method for forming a pad on a first shield member 200 according to various embodiments.

In operation 901, a first shield member 200 may be stably placed on a jig.

In operation 903, after a mask is stably placed on a first shield cover 202 stably placed on the jig, a solder resist 231 may be applied to the first shield cover 202.

In operation 905, a flux may be applied after the mask is removed.

In operation 907, a solder paste may be applied after a metal mask having an opening corresponding to the flux is stably placed on the first shield cover 202. The solder paste may include a conductive material.

Figure 10:
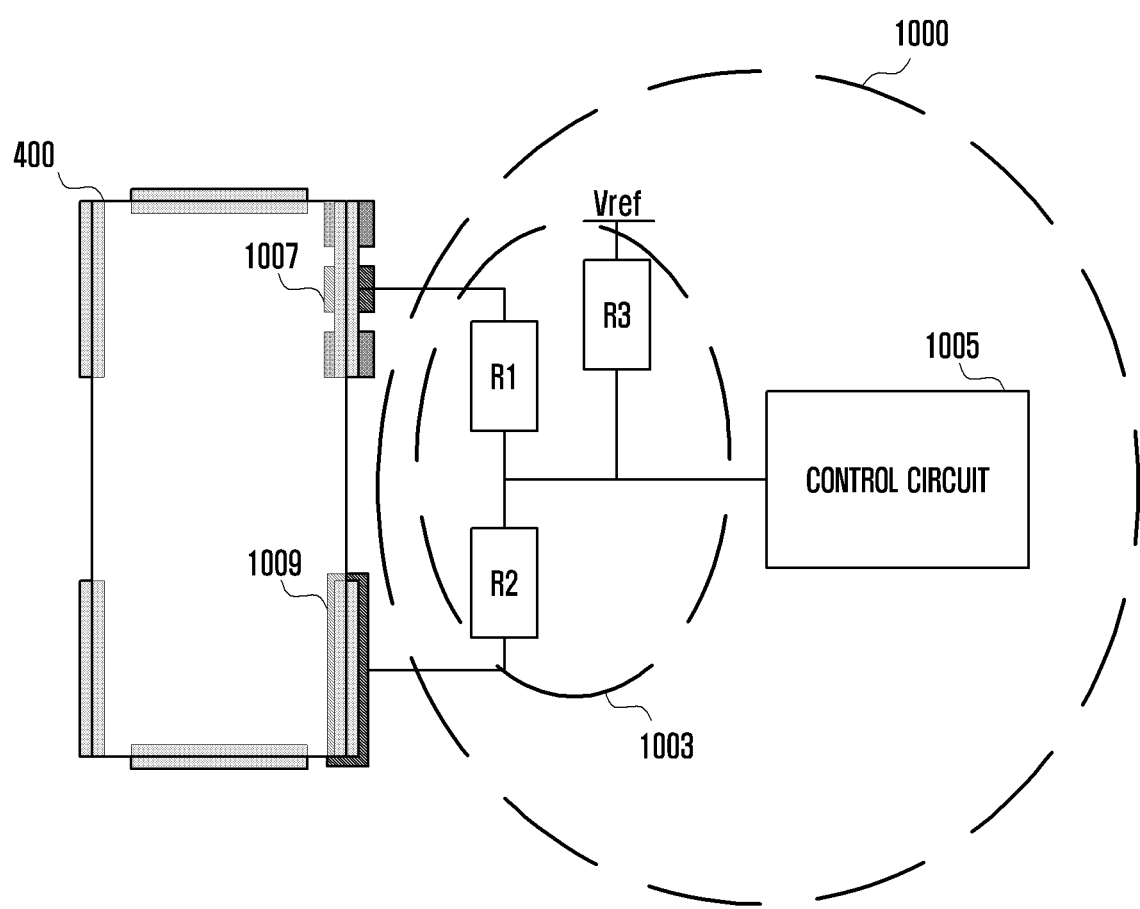
FIG. 10 is a diagram illustrating an example method for representing a test operation according to various embodiments.

FIG. 10 is a diagram illustrating an example test operation according to various embodiments.

A test apparatus 1000 may include a voltage divider 1003 and a control circuit 1005. If a shield case 10 is coupled to a substrate 400 by a surface mount technology, at least one conductive path 1007 and 1009 connected to the shield case 10 is disposed at the bottom of the substrate 400. The test apparatus 1000 may transmit a voltage to a first conductive path 1007 and a second conductive path 1009 through the voltage divider 1003. The test apparatus 1000 may identify a voltage difference between the first conductive path 1007 and the second conductive path 1009 through the control circuit 1005. The control circuit 1005 may determine that the shield case 10 is stably placed on the substrate 400 if the voltage difference between the first conductive path 1007 and the second conductive path 1009 is within a predetermined or specified range.

In various embodiments, the substrate 400 may isolate one of pads for coupling to the shield case 10. If the shield case 10 is properly coupled to the substrate 400, the at least one conductive path 1007 and 1009 connected to the shield case 10 is disposed at the bottom of the substrate 400, and the isolated pad may be connected to a ground through the shield case 10.

If one of the conductive paths 1007 and 1009 is connected to the ground, the voltage divider 1003 operates as a pull down and/or pull up resistor, and a voltage value may be input to an ADC port of the test apparatus 1000. The test apparatus 1000 may determine whether the shield case 10 is properly coupled to the substrate 400 according to a voltage value input to the ADC port.

Figure 11:
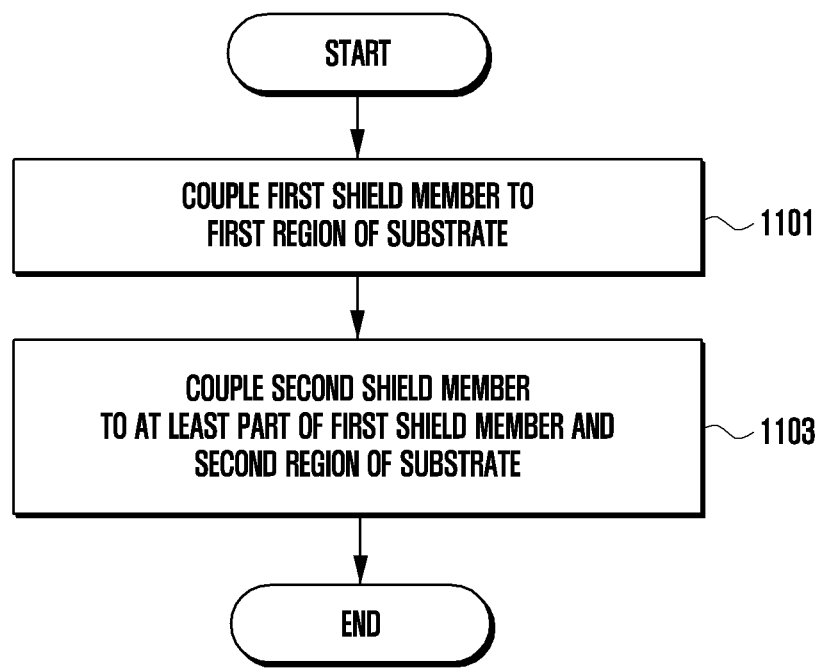
FIG. 11 is a flowchart illustrating an example method for coupling a shield case to a substrate according to various embodiments.

FIG. 11 is a flowchart illustrating an example method of coupling a shield case to a substrate according to various embodiments.

In operation 1101, a first shield member 200 may be coupled to a first region 410 of a substrate 400. The first shield member 200 may be coupled to the substrate 400 by, for example, and without limitation, a surface mount technology (SMT) or may be coupled using an adhesive member.

In operation 1103, a second shield member 300 may be coupled to at least a part of the first shield member and a second region 420 of the substrate 400. The second shield member 300 may be coupled to at least a part of the first shield member and/or the substrate 400 by, for example, and without limitation, a surface mount technology (SMT) or may be coupled using an adhesive member and/or a fixing member (e.g., a clip).

An electrically conductive silicone paste may be applied to a junction portion to which the first shield member 200 and the second shield member 300 are coupled. A shielding, conductive, and heat-dissipating paste and/or an adhesive member (e.g., a tape) may be applied and/or attached to the junction portion to which the first shield member 200 and the second shield member 300 are coupled.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a substrate;
   a first electronic component mounted on a first region of a surface of the substrate;
   a second electronic component mounted on a second region of the surface of the substrate;
   a first electromagnetic interference (EMI) shield configured to shield the first electronic component; and
   a second EMI shield configured to shield the second electronic component,
   wherein the first EMI shield includes a first shield cover and a first shield frame configured to surround the first electronic component between the first shield cover and the first region,
   wherein the second EMI shield includes a second shield cover and a second shield frame, and
   wherein the second shield frame and a portion of the first shield frame are configured to surround the second electronic component between the second shield cover and the second region.

2. The electronic device of claim 1, wherein the first shield frame and the first shield cover are integral.

3. The electronic device of claim 1, wherein the first shield cover is spaced from the substrate by a first height.

4. The electronic device of claim 3, wherein the second shield cover is spaced from the substrate by a second height.

5. The electronic device of claim 4, wherein the second shield frame comprises three side surfaces and the second electronic component is surrounded by the three side surfaces of the second shield frame and one side surface of the first shield frame.

6. The electronic device of claim 3, wherein the second shield frame comprises an open side corresponding to a side surface of the first shield frame.

7. The electronic device of claim 1, wherein the second shield cover is supported by at least a part of the first shield frame and/or at least a part of the first shield cover.

8. The electronic device of claim 1, wherein a height difference between the second shield frame and the first shield frame corresponds to a thickness of the second shield cover.

9. The electronic device of claim 3, wherein the first shield frame comprises a region coupled to the second shield frame and having a third length, the third length being a difference between a thickness of the second shield cover and the first height.

10. The electronic device of claim 9, wherein the first shield cover comprises a region coupled to the second shield cover and a height difference between the second shield frame and the first shield frame corresponds to a thickness of the second shield cover.

11. The electronic device of claim 1, wherein the first shield cover comprises a pad comprising a solder resist and a conductive material layer disposed in a region in which the second shield frame is supported by the first shield cover.

12. The electronic device of claim 1, wherein the first shield cover comprises a first fixing member comprising a clip and/or a socket in a region in which the second shield frame is supported by the first shield cover.

13. The electronic device of claim 12, wherein a second fixing member is disposed on a region of the substrate in which the substrate is coupled to the second shield frame and comprises a clip and/or a socket.

14. A method for mounting a shield case of an electronic device comprising a substrate on which first and second electronic components are mounted on a surface thereof, the method comprising:
- coupling, to a substrate, a first electromagnetic interference (EMI) shield for shielding the first electronic component, the first EMI shield including a first shield cover and a first shield frame configured to surround a first electronic component between the first shield cover and a first region; and
- coupling, to the substrate, a second EMI shield, the second EMI shield including a second shield cover and a second shield frame,
- wherein the second shield frame and a portion of the first shield frame are configured to surround the second electronic component between the second shield cover and a second region.

* * * * *